United States Patent

Kibar et al.

[11] Patent Number: 6,137,339
[45] Date of Patent: Oct. 24, 2000

[54] HIGH VOLTAGE INTEGRATED CMOS DRIVER CIRCUIT

[75] Inventors: Osman Kibar, San Diego, Calif.; Ashok V. Krishnamoorthy, Middletown, N.J.

[73] Assignee: Lucent Technologies Inc., Murray Hill, N.J.

[21] Appl. No.: 09/138,177

[22] Filed: Aug. 21, 1998

Related U.S. Application Data

[60] Provisional application No. 60/057,717, Aug. 28, 1997.

[51] Int. Cl.[7] .................................................. H03L 5/00
[52] U.S. Cl. .......................................... 327/333; 327/112
[58] Field of Search .................................. 327/108, 109, 327/110, 111, 112, 319, 333, 404, 419, 427; 326/80, 81

[56] References Cited

U.S. PATENT DOCUMENTS

| | | | |
|---|---|---|---|
| 5,502,412 | 3/1996 | Choi et al. ............................... | 327/333 |
| 5,504,450 | 4/1996 | McPartland .............................. | 327/437 |
| 5,747,979 | 5/1998 | Nagai ...................................... | 323/349 |
| 5,751,179 | 5/1998 | Pietruszynski et al. ................. | 327/379 |
| 5,808,480 | 9/1998 | Morris ..................................... | 326/81 |
| 5,850,159 | 12/1998 | Chow et al. ............................. | 327/394 |
| 5,892,371 | 4/1999 | Maley ...................................... | 326/81 |
| 5,926,056 | 7/1999 | Morris et al. ............................ | 327/333 |
| 5,939,932 | 8/1999 | Lee .......................................... | 327/436 |
| 5,963,067 | 10/1999 | Boucher .................................. | 327/112 |

*Primary Examiner*—Jeffrey Zweizig

[57] ABSTRACT

A high voltage integrated driver circuit having a control stage and a driver stage. The control stage receives a low voltage signal having a predetermined voltage swing, and produces first and second stepped-up output signals having the predetermined voltage swing. A driver stage having an upper section and a lower section is connected to the control stage such that the upper section receives the first stepped-up output signal and the second section receives the second stepped-up output signal. Each driver section outputs, from a respective output terminal, and output voltage signal such that the voltage range across the output terminals is larger than the predetermined voltage swing of the low voltage signal.

6 Claims, 1 Drawing Sheet

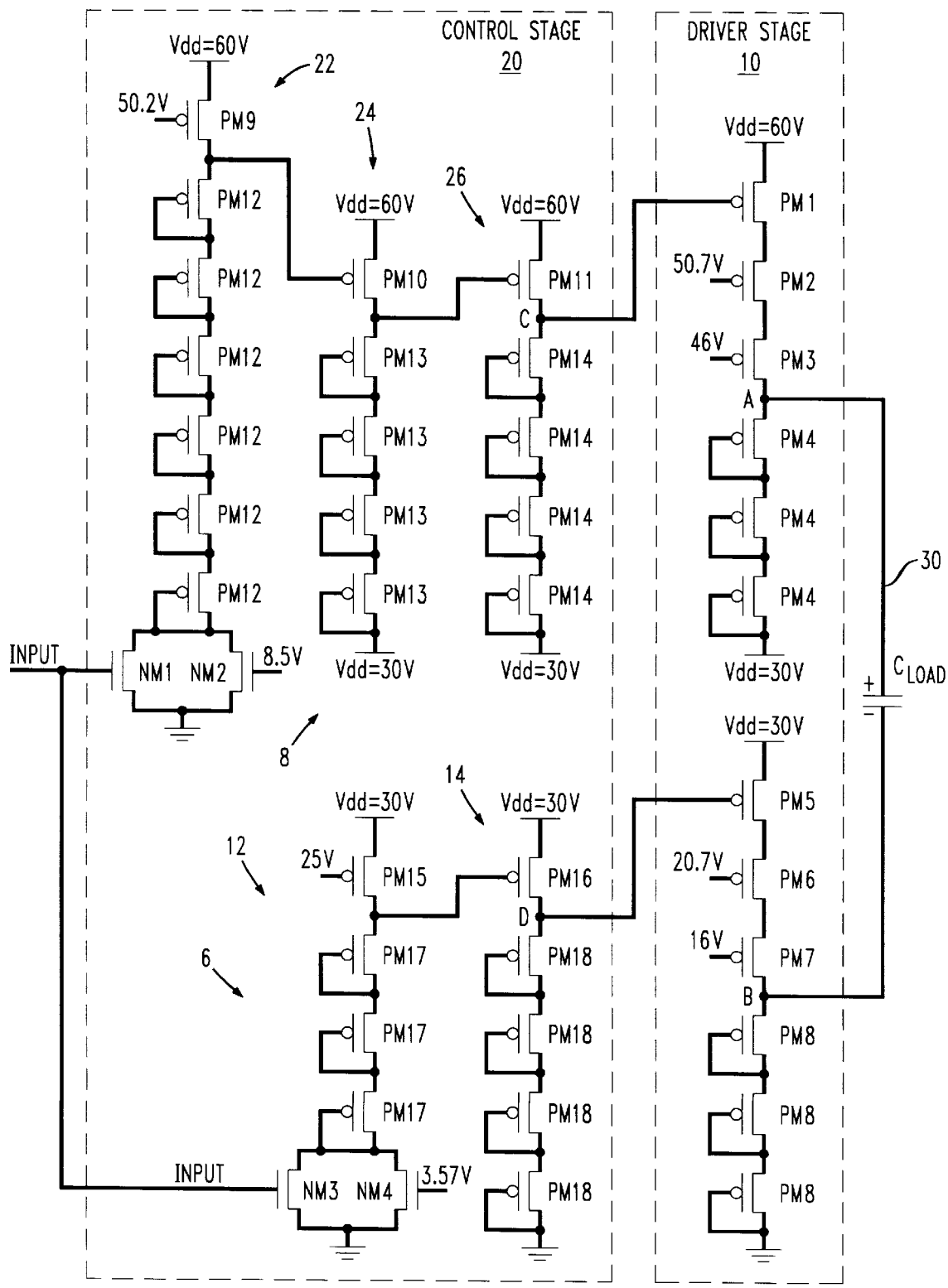

HIGH VOLTAGE INTEGRATED CMOS DRIVER CIRCUIT

RELATED APPLICATIONS

This application claims priority from U.S. Provisional Patent Application Serial No. 60/057,717 which was filed on Aug. 28, 1997.

BACKGROUND OF THE INVENTION

I. Field of the Invention

The present invention is directed to a driver circuit which produces an output voltage of 20V and higher. In particular, the present invention provides a high voltage driver circuit constructed of CMOS technology and capable of producing an output voltage swing of 20V-40V.

II. Description of the Related Art

A number of optical modulator technologies are currently being considered for fiber-to-the-home applications wherein downstream light on a fiber is modulated and the data signal is returned upstream. Such devices have also been suggested for use in linear-array formats to facilitate wavelength-division multiplexing. Other devices have been proposed for high-density two-dimensional chip-to-chip interconnect applications which require input drive signals in the range of 20V-40V for effective performance. However, typical commodity silicon VLSI technologies can only provide drive voltages of about 5V. Although conventional driver chips using special purpose technologies can provide higher voltage swings at moderate speeds of a few Mb/s, an integrated driver circuit is needed to provide a low cost, low volume, high-speed (1 Mbit/s to≧100 Mb/s) packaged device capable of producing an output voltage range of 20V-40V.

The main deterrent in designing a high-voltage driver circuit in widely available CMOS technologies is the low breakdown voltage of the transistors. Breakdown can occur due to punch-through of electrons through the gate oxide or when two depletion regions merge to cause a short. For instance, data acquired from the MOSIS CMOS foundry has established that the minimum measured punch-through voltages of a PMOS are 8.6V, 11.0V, 11.9V and 12.5V for the 0.5 $\mu$m, 0.8 $\mu$m, 1.2$\mu$, and 2.0 $\mu$m CMOS technologies, respectively. A high-voltage driver circuit must therefore provide large output swings while ensuring that the voltage between any pair of nodes is at all times below its specified breakdown voltage.

SUMMARY OF THE INVENTION

The inventive high-voltage driver circuit operatively divides the total desired voltage swing by two, and separately applies each portion of the swing to the nodes of a load device, such as a capacitor or capacitive load. To accomplish this, the driver circuit has two separate stages: a control stage and a driver stage. The control stage receives a relatively low voltage (e.g. 0–5V) having a relatively small voltage swing and steps up the voltage to a higher output voltage in a lower output of the control stage. This output is fed to a lower input of the driver stage which broadens the voltage range and outputs a stepped-up voltage range having a wider range than the small voltage swing output by the control stage.

In a preferred embodiment, the control stage has a lower output section which outputs a voltage of up to 25–30V, and an upper output section which outputs a voltage of up to 55–60V, with each section providing a stepped-up small voltage swing signal to inputs of the driver stage. The driver stage has an upper output and a lower output. When the driver stage outputs are connected across terminals of a load device, a broad voltage swing having a stepped-up voltage is produced.

In the preferred embodiment, the driver stage is formed of two identical sets of PMOS transistors connected in series. Two separate Vdds are used in the upper and lower parts of the driver stage of the circuit, respectively. The load device (e.g. capacitor) can therefore be charged or discharged, for example, simultaneously through two separate current paths.

The control stage of the circuit is designed to take an input voltage of as low as 5V and produce an output voltage range of about 55–60V in the upper output of the control stage, and of up to 25–30V in the lower output of the control stage. The driver stage is divided into two series-connected transistor sets, with each set receiving, as an input, one of the outputs of the control stage. Each transistor set in the driver stage produces up to a 20V voltage swing at its respective output.

Each transistor set in the driver stage has a controlling transistor (the top one) having a fixed gate voltage and a fixed Vdd. The voltages are selected to ensure that the controlling transistors are maintained in a safe operating range, i.e. to avoid breakdown. The preferred Vdd values are 60V or less for the upper set of transistors, and 30V or less for the lower set of transistors. This feature also removes the potential cause of current drift (i.e. current outside of the desired operating range) because the total current flow is related to fabrication process variations in the gate-to-source voltage (Vgs=Vg−Vs) of the controlling transistor. Thus, the only remaining source of such variations is the gate voltage (Vg) of the controlling transistors which may vary as a result of the fabrication process, such as from a variation in the threshold voltage of the PMOS.

The use of a single transistor with a fixed source voltage as a controlling transistor also allows the input to the driver stage to operate a synchronously (i.e. without a certain required timing relationship) with respect to the driver output voltage while preventing breakdown of the transistor. To obtain proper operation, the circuit must ensure that the two nodes across which the load device is connected swing in opposite directions at exactly the same time—when one output voltage is rising, the other output voltage must be falling. This translates into a strict timing requirement for the input to the gates of the controlling transistors in the upper and lower parts of the driver stage.

For the particular high voltage driver circuit described herein, a 5-Volt, 0.8 $\mu$m n-well CMOS fabrication process may be used to improve area and speed without sacrificing output swing. The maximum allowable Vdd is chosen to be 60V, which is the breakdown voltage between an n-well and the p-substrate. The breakdown voltage of p-diffusion to n-well, and n-diffusion to p-substrate, is slightly above the punch-through voltage. This requires that every PMOS have its own floating n-well connected to its source, and that any NMOS have its source grounded in the common substrate. The latter restriction can be ignored if a twin-tub process is employed because each NMOS can then also have its individual floating well with its source connected to its well contact.

Other objects and features of the present invention will become apparent from the following detailed description considered in conjunction with the accompanying drawings. It is to be understood, however, that the drawings are designed solely for purposes of illustration and not as a definition of the limits of the invention.

BRIEF DESCRIPTION OF THE DRAWINGS

In the drawings;

The FIGURE is a schematic diagram of a high voltage integrated driver circuit constructed in accordance with the present invention.

DETAILED DESCRIPTION OF THE PRESENTLY PREFERRED EMBODIMENTS

The operation of the driver circuit will now be described with specific reference to the FIGURE. As there shown, a preferred embodiment of the inventive driver circuit is formed as the combination of a driver stage 10 connected to a control stage 20. A load 30, shown, by way of example as a capacitive load, is connected between nodes A and B of the driver stage 10. Driver stage 10 includes two identical sets of series-connected PMOS transistors. The upper or top (in the figure) set contains transistors PM1–PM4 which provide voltage to node A, and the lower set contains transistors PM5–PM8 which provide voltage to node B. As shown, transistors PM1 and PM4 are connected to different values of Vdd; the maximum values of Vdd are indicated as 60V and 30V, respectively.

For each of the upper and lower sets of the driver stage transistors, the top-most device (PM1 and PM5, respectively) acts as a controller for that particular set and its gate voltage is supplied by the control stage 20. The gate voltages of the next two transistors in each group (PM2–PM3 and PM6–PM7, respectively) are fixed at values optimized to maximize the output voltage swing without increasing the probability of unexpected breakdown resulting from fabrication process variations. The remaining transistors in each set (i.e. three PM4 transistors and three PM8 transistors) distribute the voltage difference between the output node B and Vdd (indicated in FIG. 1 as 30V or ground).

Referring now to the first set of PMOS devices PM1–PM4—which are shown as series-connected or tied between Vdd's of 60V and 30V—an increase in the gate voltage of PM1 causes the voltage Vgs and the current flowing through PM1 to decrease because the source terminal is tied to 60V. In a steady state condition where the capacitive load is either fully charged or fully discharged, a common current flows through the lower three transistors PM4. Each of the transistors PM4 has its gate and drain terminals tied together so that Vgs=Vds. As the current flow decreases, the value of Vgs drops which, in turn, lowers the voltage at node A. Simultaneously, the source voltages of transistors PM2 and PM3 decrease to accommodate the reduced current flow. The resulting effect is that the difference between the high voltage source (60V) and the voltage at node A is distributed evenly across transistors PM1–PM3 and the Vds or Vgs of all of the driver stage transistors in the first or upper set are maintained below their breakdown voltages. It should be noted that if lower Vdd values are used, the outputs at nodes A and B will be reduced, thus reducing the output voltage swing of the circuit.

Similarly, when the gate voltage of PM1 is decreased, the current through it increases. The bottom transistors PM4 increase their Vds to match the current flow and the output voltage at node A goes high, with the difference between the output and the lower Vdd value (i.e. 30V) being evenly distributed across the three PM4 transistors. At the same time, the source voltages of PM2 and PM3 increase to accommodate the increase in current until a steady state condition is reached, thus preventing breakdown of the transistors.

The lower set of CMOS devices (PM5–PM8) operates in the same fashion as described with respect to the upper set, except that the output voltage at node B goes high when the output voltage at node A goes low, and vice versa.

The control stage 20 of the inventive driver circuit receives at the circuit input a low voltage input swing (0–5V) and operatively produces two simultaneous output signals at nodes C and D comprising the same magnitude voltage swing as the input swing but at a higher voltage. As shown in the FIGURE the control stage 20—somewhat akin to the driver stage 10—is formed of the combination of a lower circuit portion 6 and an upper circuit portion 8. The lower circuit portion contains two sets of transistors, namely set 12 and set 14. Transistor set 12 includes one PMOS transistor PM15 and three PMOS transistors PM17, and two NMOS transistors NM3 and NM4. Transistor set 14 similarly includes one PMOS transistor PM16 and four PMOS transistors PM18. Each transistor in each of the sets 12, 14 has a floating n-well connected to its respective source region. Transistor NM4 is biased in an "on" condition so that current will continue to flow through all of the PMOS transistors in set 12 to thereby prevent any node from rising to Vdd and causing a possible device breakdown. Transistor NM3 receives the circuit input signal at its gate terminal for controlling the total current flowing through transistors PM15 and PM17 which, in turn, controls the voltage at the drain terminal of transistor PM 15. This drain terminal voltage is provided to the gate of PMOS transistor PM16 for regulating the current through transistors PM16 and PM18 to, in turn, set the voltage at node D which becomes the gate voltage of transistor PM5 of the driver stage 10.

The top transistor PM15 in the transistor set 12 receives a drain voltage of Vdd=30V and a gate voltage of 25V. The voltage at the source terminal of device PM15 controls the gate terminal of transistor PM16 of the second set 14 of transistors. Each of the three transistors PM17 of the first set 12, and the four transistors PM18 of the second set 14 has its gate and drain terminals tied together, and these transistors are matched to evenly distribute the difference between Vdd and ground (i.e. 30V) across all of the transistors in both sets 12 and 14 to avoid device breakdown.

The upper portion 8 of the control stage 20 is formed of three sets 22, 24, 26 of transistors which generate a voltage at node C that is then provided to the gate of transistor PM1 of the driver stage 10. Transistor NM1 of set 22 controls the total current flow in the upper portion, which in turn determines the voltage levels at the desired nodes, i.e. the nodes between transistors. Transistor NM2 of set 22 is biased to remain on so as to ensure continuous current flow and thereby prevent any nodes from floating up to Vdd (indicated in FIG. 1 as 60V). The series-connected transistors PM 12 in set 22 serve to distribute the voltage evenly therebetween and along the set. The high-voltage CMOS driver circuit described herein thus maintains at all times at least a small amount of current flow through every node in the circuit to prevent any node from floating up or rising to voltages in excess of the device breakdown values due to leakage currents.

The upper portion 8 of control stage 20 operates in a manner similar to that described above with respect to the lower portion 6, except that the upper portion 8 additionally includes a third set 26 of series connected transistors. When the voltage at node C goes high, the voltage at node D goes low. These voltages at nodes C and D are provided to the gate terminals of the driver stage transistors PM1 and PM5, respectively, to generate a wide, high-voltage swing across load 30.

The circuit shown in FIG. 1 and hereinabove described may be and is preferably implemented purely in CMOS. The operating bandwidth of the driver circuit can be over 100 Mbit/s, depending on the size of the output load and the maximum allowable power dissipation. For a given load size, the driver stage 10 of the inventive circuit may as a matter of design choice be scaled to trade-off speed for static power dissipation. The driver circuit can be implemented in an area of less than 500 μm×500 μm using 0.8 micron CMOS technology, thereby permitting linear arrays of the inventive driver to be readily fabricated for optoelectronic modulator array applications. The circuit can moreover be modified to achieve comparable output voltage swings with even finer-linewidth CMOS technologies despite the resulting decreased breakdown voltages, as by connecting additional PMOS transistors in series for each of the two stages, i.e. the driver stage 10 and control stage 20.

The inventive driver circuit provides a number of significant benefits. For example, no extra processing of the input is needed, thus eliminating the need for an external 5V supply. As a consequence, only two supply voltages are needed which, in the illustrated embodiment, are 60V and 30V. Also, the fixed voltages can all be obtained from a linear integrated resistor of polysilicon wire which may be fabricated directly on the CMOS chip and across which voltages of 0V and 60V are applied. Since the resistor is linear, it can be readily tapped at different points to obtain each of the necessary voltages for circuit operation. This eliminates the need for additional external voltage supplies and also provides constant gate voltages that are referenced to the supply voltage in the presence of process variations in the resistivity of polysilicon.

Furthermore, the absolute dimension sizes of the transistors in the driver stage 10 may be scaled to trade-off speed for static power dissipation. In doing so, it is only necessary to keep the dimension size ratio of the transistors the same, because the voltage on a given node depends on this ratio.

Thus, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, although the inventive circuit is described above with the control stage having an upper and lower section, and the driver stage as having an upper and lower section, both stages can be designed as having single sections. It is expressly intended that all combinations of those elements which perform substantially the same function in substantially the same way to achieve the same results are within the scope of the invention. It is the intention, therefore, to be limited only as indicated by the scope of the claims appended hereto.

What is claimed is:

1. A high voltage driver circuit, comprising:

a control stage having an input, a lower output section, and an upper output section, said control stage receiving at said input a low voltage signal having a predetermined voltage swing magnitude, outputting at said lower output section a first stepped-up voltage signal having said predetermined voltage swing magnitude and outputting, at said upper output section, a second stepped-up voltage signal having said predetermined voltage swing magnitude; and a driver stage connected to said control stage, said driver stage having a lower section with a lower output for receiving, as an input signal, said first stepped-up voltage signal and producing a lower section output signal on said lower output, and an upper section having an upper output, said upper section receiving as an input said second stepped-up voltage signal and producing an upper section output signal on said upper output, said upper and lower sections of said driver stage comprising a plurality of PMOS transistors with each PMOS transistor formed in a corresponding n-well and having a source terminal, each said PMOS transistor being configured for maintaining a potential of said corresponding n-well at a potential of the source terminal of the said each PMOS transistor while allowing the n-wells in said plurality of PMOS transistors to have different potentials from each other, so that the upper and lower sections of said driver stage can operatively accommodate an output voltage swing across said upper and lower outputs of said driver stage having a voltage swing magnitude larger than the predetermined voltage swing magnitude.

2. The circuit of claim 1, wherein each of said control stage and said driver stage comprises CMOS transistors.

3. The circuit of claim 1, wherein an average value of said second stepped-up voltage signal is greater than an average value of said first stepped-up voltage signal.

4. The circuit of claim 2, wherein each of said driver stage upper section and lower section includes a controlling transistor having a fixed gate voltage and a fixed drain voltage ($V_{dd}$).

5. The circuit of claim 2, wherein said controller stage comprises PMOS transistors.

6. The circuit of claim 2, wherein a maximum $V_{dd}$ value for said driver stage upper section is 60V and a maximum $V_{dd}$ value for said driver stage lower section is 30V.

* * * * *